United States Patent
Shi (10) Patent No.: US 10,770,425 B2
(45) Date of Patent: Sep. 8, 2020

(54) FLIP-CHIP METHOD

(71) Applicant: TONGFU MICROELECTRONICS CO., LTD., Nantong (CN)

(72) Inventor: Lei Shi, Nantong (CN)

(73) Assignee: TONGFU MICROELECTRONCS CO., LTD., Nantong (CN)

( * ) Notice: Subject to any disclaimer, the term of this patent is extended or adjusted under 35 U.S.C. 154(b) by 0 days.

(21) Appl. No.: 16/235,238

(22) Filed: Dec. 28, 2018

(65) Prior Publication Data
US 2019/0385974 A1    Dec. 19, 2019

(30) Foreign Application Priority Data

Jun. 14, 2018   (CN) .......................... 2018 1 0613755
Jun. 14, 2018   (CN) .......................... 2018 1 0613775

(51) Int. Cl.
*H01L 21/00*    (2006.01)
*H01L 23/00*    (2006.01)

(52) U.S. Cl.
CPC .............. *H01L 24/81* (2013.01); *H01L 24/13* (2013.01); *H01L 24/16* (2013.01); *H01L 2224/10175* (2013.01); *H01L 2224/13565* (2013.01); *H01L 2224/13686* (2013.01); *H01L 2224/16238* (2013.01); *H01L 2224/81002* (2013.01); *H01L 2224/8102* (2013.01); *H01L 2224/81007* (2013.01); *H01L 2224/81193* (2013.01); *H01L 2224/81815* (2013.01); *H01L 2924/3841* (2013.01)

(58) Field of Classification Search
None
See application file for complete search history.

(56) References Cited

U.S. PATENT DOCUMENTS

| | | | | |
|---|---|---|---|---|
| 4,963,002 A | * | 10/1990 | Tagusa ................... | H01L 21/563 257/E21.503 |
| 7,732,253 B1 | * | 6/2010 | Morris ..................... | H01L 24/11 257/778 |
| 2006/0113640 A1 | * | 6/2006 | Yu ......................... | H01L 23/3114 257/635 |
| 2009/0159641 A1 | * | 6/2009 | MacKay ................. | B23K 35/22 228/41 |
| 2013/0299965 A1 | * | 11/2013 | Gandhi ................ | H01L 23/3142 257/737 |
| 2016/0300808 A1 | * | 10/2016 | Kuo ......................... | H01L 24/11 |

* cited by examiner

*Primary Examiner* — Calvin Y Choi
(74) *Attorney, Agent, or Firm* — Anova Law Group, PLLC (57) ABSTRACT

A flip-chip method includes providing a semiconductor chip and conductive connection pillars. Each of the conductive connection pillars has a first surface and a second surface opposite to the first surface. The flip-chip method also includes fixing the conductive connection pillars on a surface of the semiconductor chip. The first surfaces face the semiconductor chip. The flip-chip method also includes providing a carrier plate, forming solder pillars on the carrier plate, and forming a barrier layer on the carrier plate around the solder pillars. The flip-chip method further includes bringing the solder pillars into contact with the second surfaces of the conductive connection pillars. The conductive connection pillars are located above the solder pillars. The flip-chip method further includes performing a reflow-soldering process on the solder pillars, thereby forming solder layers from the solder pillars.

20 Claims, 8 Drawing Sheets

FLIP-CHIP METHOD

CROSS-REFERENCES TO RELATED APPLICATIONS

This application claims priority of Chinese Patent Application No. 201810613775.4 and Chinese Patent Application No. 201810613755.7, both filed on Jun. 14, 2018, the entire contents of which are hereby incorporated by reference.

FIELD OF THE INVENTION

The present disclosure generally relates to the field of packaging and, more particularly, relates to a flip-chip method.

BACKGROUND

A flip-chip method is a chip-interconnect technology, and is also an ideal chip-bonding technology. International Business Machines Corporation (IBM) developed and used a flip-chip technology more than 50 years ago. However, it is until recently that the flip-chip method became used in packaging high-end devices and in high-density packaging. Currently, the flip-chip packaging technology has been more widely used, with diversified packaging forms and increased demands.

However, in an existing flip-chip method, the quality of solder layers is undesirable, and adjacent solder layers may be connected with one another. The disclosed methods and structures are directed to solve one or more problems set forth above and other problems in the art.

BRIEF SUMMARY OF THE DISCLOSURE

One aspect of the present disclosure includes a flip-chip method. The flip-chip method includes providing a semiconductor chip and conductive connection pillars. Each of the conductive connection pillars has a first surface and a second surface opposite to the first surface. The flip-chip method also includes fixing the conductive connection pillars on a surface of the semiconductor chip. The first surfaces face the semiconductor chip. The flip-chip method also includes providing a carrier plate, forming solder pillars on the carrier plate, and forming a barrier layer on the carrier plate around the solder pillars. The flip-chip method further includes bringing the solder pillars into contact with the second surfaces of the conductive connection pillars. The conductive connection pillars are located above the solder pillars. The flip-chip method further includes performing a reflow-soldering process on the solder pillars, thereby forming solder layers from the solder pillars.

Another aspect of the present disclosure includes another flip-chip method. The flip-chip method includes providing a semiconductor chip and conductive connection pillars. Each of the conductive connection pillars has a first surface and a second surface opposite to the first surface. The flip-chip method also includes fixing the conductive connection pillars on a surface of the semiconductor chip. The first surfaces face the semiconductor chip. The flip-chip method also includes forming first barrier layers on sidewalls of the conductive connection pillars. The first barrier layers expose the second surfaces of the conductive connection pillars. The flip-chip method also includes providing a carrier plate, forming solder pillars on the carrier plate, and forming a second barrier layer on the carrier plate around the solder pillars. The flip-chip method further includes bringing the solder pillars into contact with the second surfaces of the conductive connection pillars. The conductive connection pillars are located above the solder pillars. The flip-chip method further includes performing a reflow-soldering process on the solder pillars, thereby forming solder layers from the solder pillars.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

A flip-chip method often results in poor-quality solder layers, and adjacent solder layers may be connected together.

Figure 1:
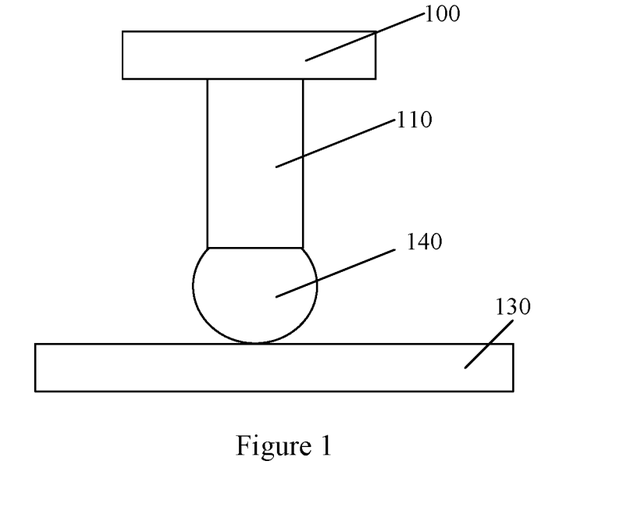
FIGS. 1 to 2 illustrate structures corresponding to certain stages of a flip-chip method.
Figure 2:
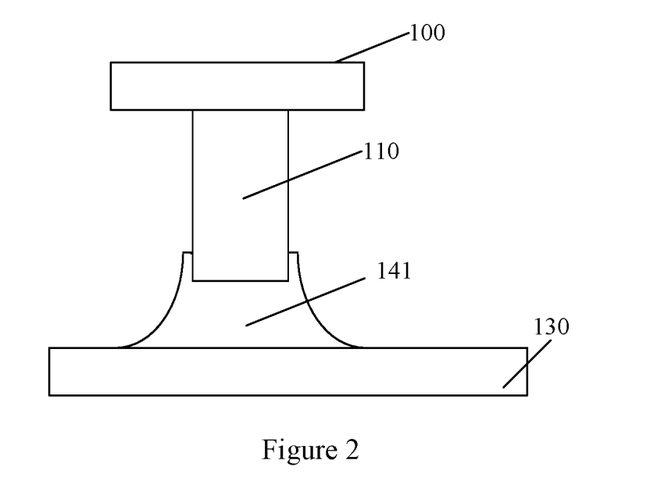

FIGS. 1 to 2 illustrate structures corresponding to certain stages of a flip-chip method. Referring to FIG. 1, a semiconductor chip 100, a conductive connection pillar 110, and a carrier plate 130 are provided. The conductive connection pillar 110 has a first surface and a second surface that are opposite to each other. The conductive connection pillar 110 is fixed on a surface of the semiconductor chip 100, and the first surface faces the semiconductor chip 100. A solder ball 140 is fixedly disposed on the second surface of the conductive connection pillar 110. After that, the semiconductor chip 100, the conductive connection pillar 110 and the solder ball 140 are placed above a surface of a carrier plate 130, and the soldered ball 140 is in contact with the surface of the carrier plate 130.

Referring to FIG. 2, after the semiconductor chip 100, the conductive connection pillar 110, and the solder ball 140 are placed above the surface of the carrier plate 130, a reflow-soldering process is performed, making the solder ball 140 to form a solder layer 141.

During the reflow-soldering process, the material of the solder ball 140 melts into liquid. Both the material of the solder ball 140 and the material of the conductive connection pillar 110 are metal. Since the material type of the solder ball 140 and the material type of the conductive connection pillar 110 are same, and the material of the solder ball 140 may be attached to the surface of the conductive connection pillar 110. During the reflow-soldering process, the material of the solder ball 140 may flow upward along a sidewall of the conductive connection pillar 110. Accordingly, voids may be formed in the solder layer 141, and thus the quality of the solder layer 141 may be degraded. Moreover, since the material of the solder ball 140 melts into liquid, under the action of gravity, the material of the solder ball 140 may flow horizontally along the surface of the carrier plate 130, causing the solder layer 141 to collapse. As a result, the bottom of the solder layer 141 may have a large radial dimension, and thus adjacent solder layers 141 may be connected together. That is, adjacent solder layers 141 may be shorted.

Figure 3:
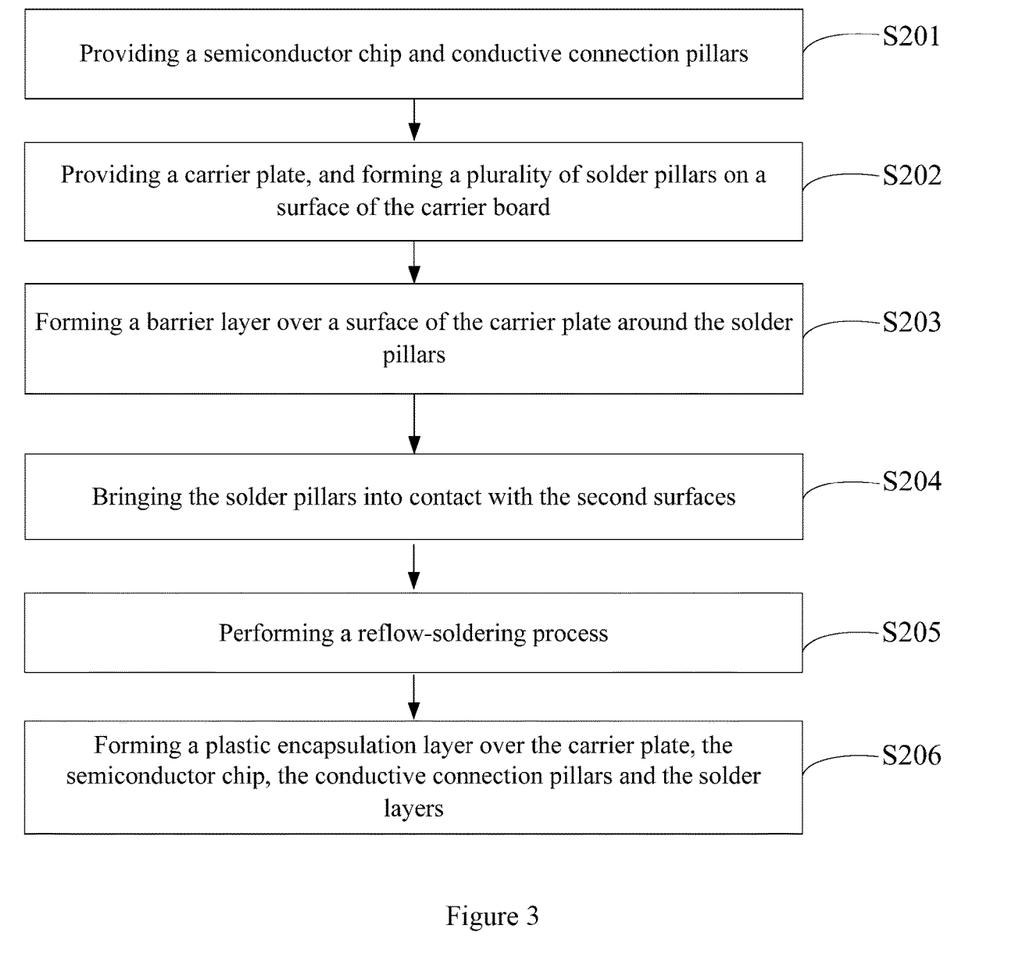
FIG. 3 illustrates a process of an exemplary flip-chip method consistent with the disclosed embodiments.

The present disclosure provides flip-chip methods. FIG. 3 illustrates a process of an exemplary flip-chip method, and FIGS. 4 to 12 illustrate structures corresponding to certain stages of the exemplary flip-chip method.

As shown in FIG. 3, the exemplary flip-chip method comprises forming a barrier layer, bringing solder pillars into contact with second surfaces of conductive connection pillars, with the conductive connection pillars being located above the solder pillars. After the solder pillars are brought into contact with the second surfaces of the conductive connection pillars, a reflow-soldering process is performed, and the solder pillars turn into solder layers. Undesirable connections between adjacent solder layers may be avoided.

Figure 4:
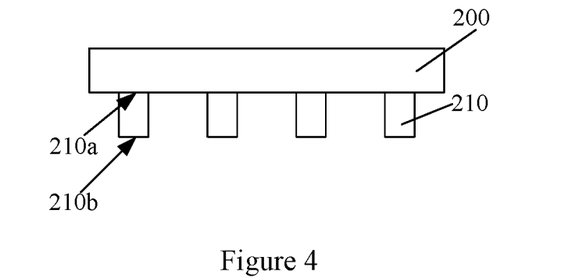
FIGS. 4 to 12 illustrate structures corresponding to certain stages of an exemplary flip-chip method consistent with the disclosed embodiments.

As shown in FIG. 3, at the beginning of a flip-chip process, a semiconductor chip 200 and conductive connection pillars 210 are provided (S201). Referring to FIG. 4, each of the conductive connection pillars 210 has a first surface 210a and a second face 210b that are opposite to each other. The conductive connection pillars 210 are fixed on a surface of the semiconductor chip 200, and the first surfaces 210a face the semiconductor chip 200.

It should be noted that, in one embodiment, there is a plurality of conductive connection pillars 210, and in some other embodiments, there may be only one conductive connection pillar.

In one embodiment, the first surfaces 210a and the second surfaces 210b are parallel to the surface of the semiconductor chip 200, and the sidewalls of the conductive connection pillars 210 are perpendicular to the surface of the semiconductor chip 200.

The material of the conductive connection pillars 210 may be metal, for example, copper. The conductive connection pillars 210 may electrically connect the semiconductor chip 200 and a subsequent carrier plate 300.

Figure 5:
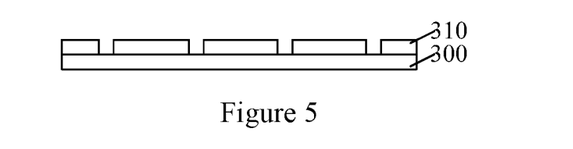
Figure 6:
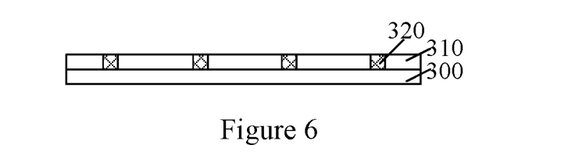
Figure 7:
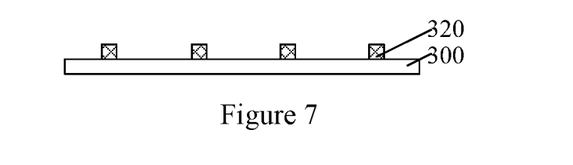

Returning to FIG. 3, a carrier plate 300 is provided, and a plurality of solder pillars 320 is formed on a surface of the carrier plate 300 (S202), and FIGS. 5-7 illustrate corresponding structures. The number of the solder pillars 320 is equal to the number of the conductive connection pillars 210. In some other embodiments, there may be only one conductive connection pillar, and there may be only one solder pillar.

After the solder pillars 320 are subsequently brought into contact with the second surfaces 210b, each of the solder pillars 320 is connected to only one of the conductive connection pillars 210. The material of the solder pillars 320 may be tin, tin-silver alloy, tin-silver-copper alloy or tin-lead alloy.

In one embodiment, the carrier plate 300 is a substrate, such as a PCB board or a BT board. In some other embodiments, the carrier may be a lead frame.

Referring to FIG. 5, a method of forming the solder pillars 320 includes forming a mesh plate 310 on a surface of the carrier plate 300, wherein the mesh plate 310 has a plurality of through holes. A distance between centers of adjacent through holes is equal to a distance between the centers of adjacent conductive connection pillars 210. Referring to FIG. 6, the method of forming the solder pillars 320 also includes respectively forming a solder pillar 320 in each of the through holes by a printing process. Referring to FIG. 7, the method of forming the solder pillars 320 further includes removing the mesh plate 310 after the printing process is performed.

The advantages of forming the solder pillars 320 by the printing process include that the plurality of solder pillars 320 formed may have a uniform shape and a uniform size, and the spacing between the solder pillars 320 may be small.

During a subsequent reflow-soldering process, the solder pillars 320 are melted. The height of the solder layers 421 is lower than the height of the solder pillars 320, while the radial dimension of the solder layers 421 may become large. In one embodiment, the radial dimension of the solder pillars 320 is designed to be smaller than the radial dimension of the conductive connection pillars 210. Such configuration may prevent the radial dimension of the solder layers 421 from being excessively large, and reduce the risk of adjacent solder layers being connected together. Further, the amount of solder materials may be reduced, and thus the costs may be decreased.

In one embodiment, the ratio of the radial dimension of the solder pillars 320 to the radial dimension of the conductive connection pillars 210 is in a range of ⅖ to ⅗, for example ½.

Figure 8:
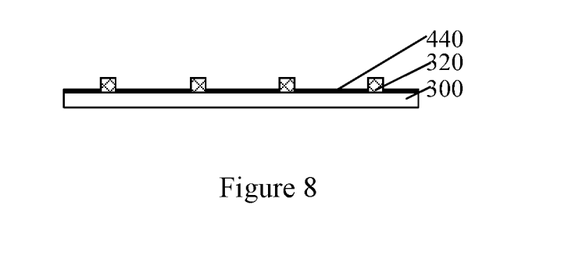
Figure 9:
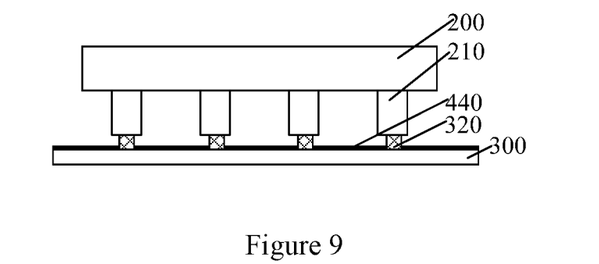

Returning to FIG. 3, a barrier layer 440 is formed (S203). As shown in FIG. 8, the barrier layer 440 is located on a surface of the carrier plate 300 around the solder pillars 320.

In one embodiment, after the mesh plate 310 is removed, a barrier layer 440 is formed on a surface of the carrier plate 300 around the solder pillars 320.

In one embodiment, the material of the barrier layer 440 is insulation glue, and the barrier layer 440 is formed after the solder pillars 320 are formed.

In some other embodiments, the material of the barrier layer may be a plastic encapsulation material, and the process of forming the barrier layer is a plastic encapsulation process. The barrier layer is formed before the solder pillars are formed.

The barrier layer 440 may prevent the material of the solder pillars 320 from flowing horizontally along the surface of the carrier plate 300 during a reflow-soldering process. Accordingly, collapse of the solder layers 421 may be prevented, and short circuits between the adjacent solder layers 421 may be avoided.

The thickness of the barrier layer 440 is less than the height of the solder pillars 320. That is, a flow space for the melted material of the solder pillars 320 is not completely sealed, and heat generated during the melting process of the solder pillars 320 may be timely released into the environment. Accordingly, the surfaces of the solder layers subsequently formed may be smooth, and the quality of the solder layers may thus be improved.

In one embodiment, the thickness of the barrier layer 440 is in a range of 10 micrometers to 30 micrometers, such as 10 micrometers, 15 micrometers, 20 micrometers, or 30 micrometers. If the thickness of the barrier layer 440 is larger than 30 micrometers, some of the material for the barrier layer 440 is wasted. Further, if the barrier layer 440 is too thick, the heat generated during the melting process of the solder pillars 320 may not be effectively dissipated. If the thickness of the barrier layer 440 is less than 10 microns, the barrier layer 440 may not effectively block the material of the solder pillars 320 during a subsequent reflow soldering process.

Returning to FIG. 3 after the barrier layer 440 is formed, the solder pillars 320 are brought into contact with the second surfaces 210b (S204). As FIG. 9, the conductive connection pillars 210 are located above the solder pillars 320, and a center of each conductive connection pillar 210s is aligned with the center of its corresponding solder pillar 320. During a subsequent reflow-soldering process, as the conductive connection pillars 210 are placed above the solder pillars 320, under the action of gravity, the melted material of the solder pillars 320 may not flow to the semiconductor chip 200.

Figure 10:
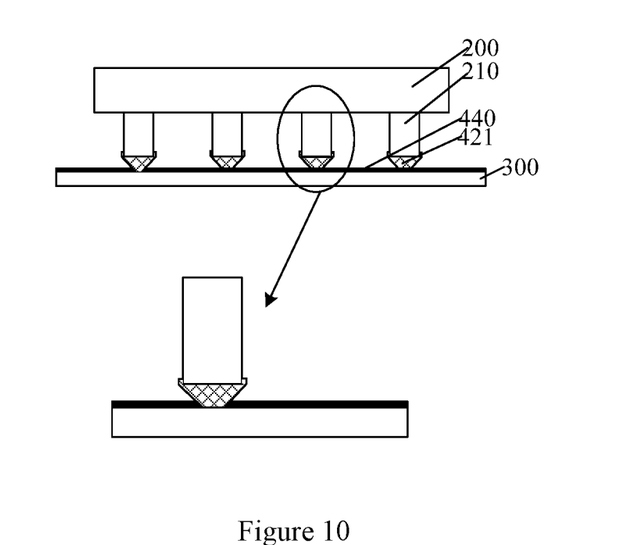

Returning to FIG. 3, after the solder pillars 320 are brought into contact with the second surfaces 210b, a reflow-soldering process is performed (S205). As shown in FIG. 10, after the reflow-soldering process, the solder pillars 320 turn intro solder layers 421.

In one embodiment, the height of the solder pillars 320 is in a range of 20 micrometers to 100 micrometers, and correspondingly, the height of the solder layers 421 is in a range of 5 micrometers to 30 micrometers.

In one embodiment, the width of the solder layers 421 gradually decreases in a direction from the conductive connection pillars 210 to the carrier plate 300 and along the normal direction of the surface of the carrier 300.

Figure 11:
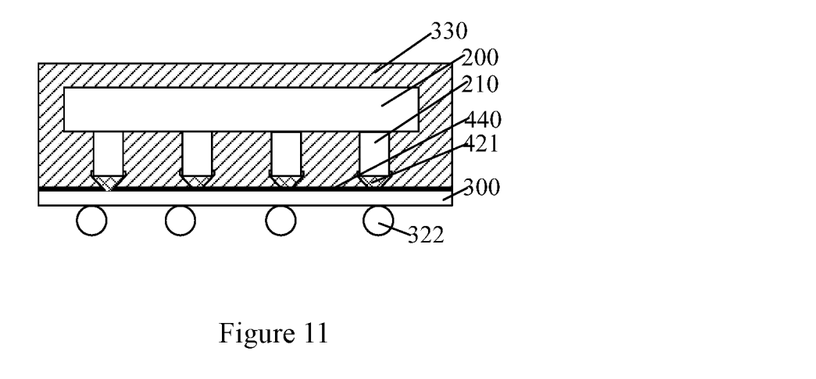

Returning to FIG. 3, after the reflow-soldering process, a plastic encapsulation layer 330 is formed above the carrier plate 300, the semiconductor chip 200, the barrier layer 440, the conductive connection pillars 210, and the solder layers 421 (S206). FIG. 11 illustrates a corresponding structure.

In some other embodiments, after the reflow-soldering process, the barrier layer 440 is removed. After the barrier layer 440 is removed, a plastic encapsulation layer is formed above the carrier, the semiconductor chip, the conductive connection pillars, and the solder layers.

In one embodiment, the carrier plate 300 is a substrate. Ball implantation is performed on a surface of the carrier plate 300 away from the semiconductor chip 200, forming solder balls 322 on a surface of the carrier plate 300 away from the semiconductor chip 200, as shown in FIG. 11.

Figure 12:
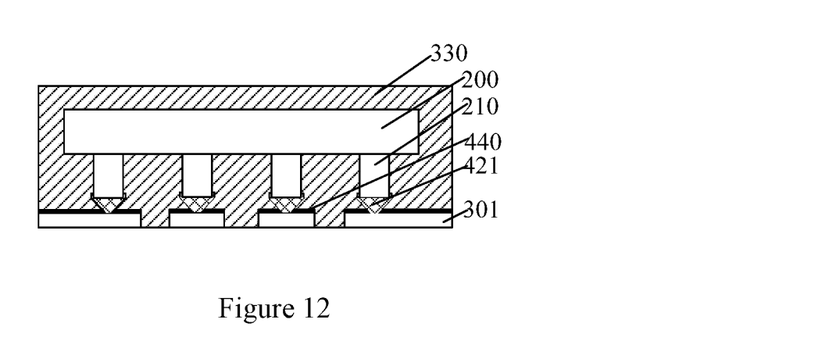

In some other embodiments, referring to FIG. 12, the carrier plate 301 is a lead frame, and ball implantation on a surface of the carrier plate 301 away from the semiconductor chip 200 is not need.

As disclosed, the technical solutions of the present disclosure have the following advantages.

In the flip-chip method provided by the technical solutions of the present disclosure, a barrier layer is formed on the surface of the carrier plate around the solder pillars before the solder pillars are brought into contact with the second surfaces. During the reflow-soldering process, the barrier layer may limit the flow space of the solder pillar material, thus avoiding the horizontal flow of the solder pillar material along the surface of the carrier plate. Thereby, the collapse of the solder layers may be avoided, and adjacent solder layers may be prevented from being connected together. Accordingly, short circuits between the adjacent solder layers may be prevented.

Figure 13:
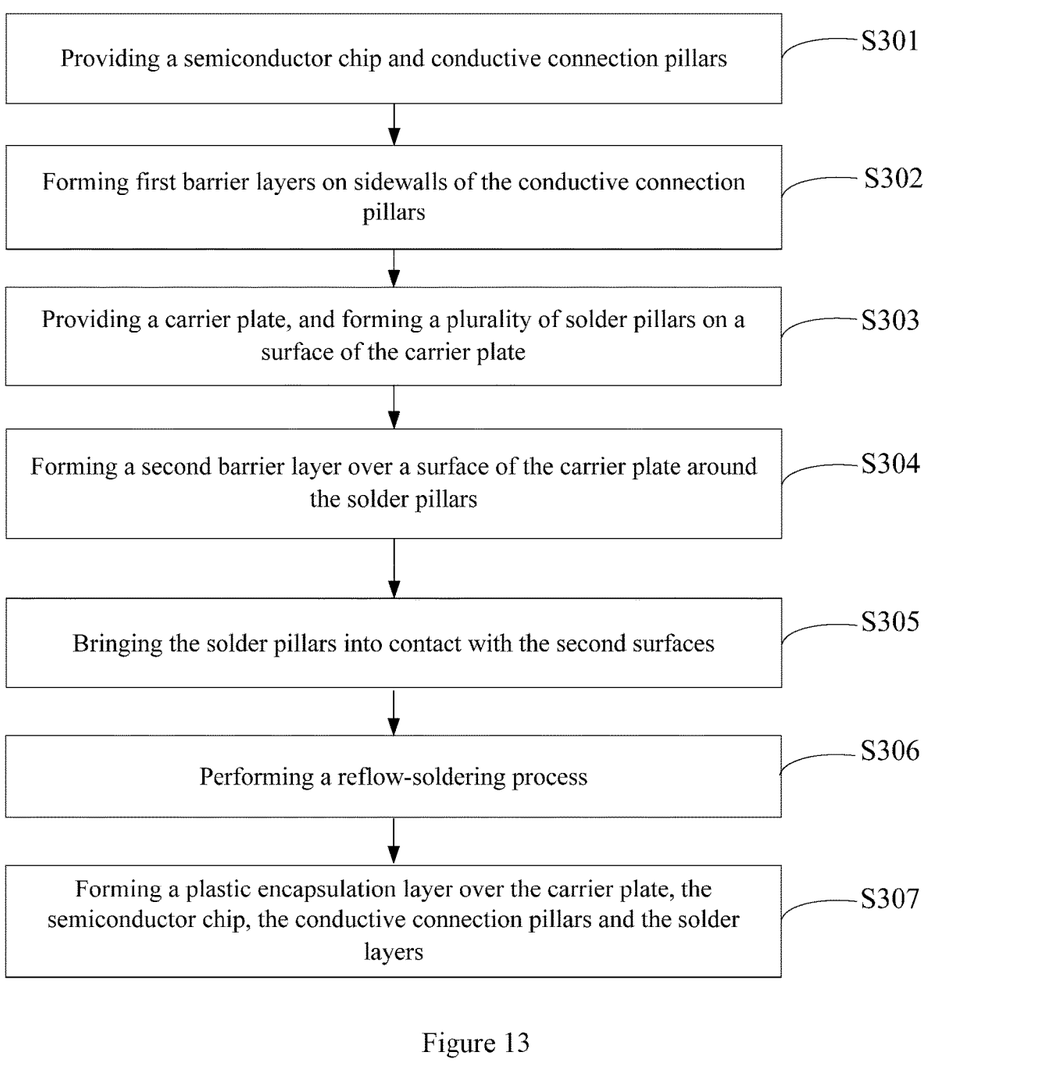
FIG. 13 illustrates a process of another exemplary flip-chip method consistent with the disclosed embodiments.

FIG. 13 illustrates a process of another exemplary flip-chip method. FIGS. 4-7 and 14 to 20 illustrate certain stages of the exemplary flip-chip method.

As shown in FIG. 13, the flip-chip process includes forming a first barrier layer on a sidewall of a conductive connection pillar, wherein the first barrier layer exposes a second surface of the conductive connection pillar; and forming a second barrier layer on a surface of a carrier plate around a solder pillar. The flip-chip process also includes, after forming the first barrier layer and the second barrier layer, bringing the solder pillar into contact with the second surface, wherein the conductive connection pillar is located above a solder pillar. The flip-chip process also includes, after the solder pillar is brought into contact with the second surface, performing a reflow-soldering process. In the reflow-soldering process, the solder pillar turns into a solder layer. As such, the quality of solder layers may be improved, and adjacent solder layers may not be connected together.

As shown in FIG. 13, at the beginning of the flip-chip method, a semiconductor chip 200 and conductive connection pillars 210 are provided (S301). Referring to FIG. 4, each of the conductive connection pillars 210 has a first surface 210a and a second surface 210b that are opposite to each other. The conductive connection pillars 210 are fixed on a surface of the semiconductor chip 200, and the first surfaces 210a face the semiconductor chip 200.

It should be noted that, in one embodiment, there is a plurality of the conductive connection pillars 210; while in some other embodiments, there may be only one conductive connection pillar.

In one embodiment, the first surfaces 210a and the second surfaces 210b are parallel to the surface of the semiconductor chip 200, and sidewalls of the conductive connection pillars 210 are perpendicular to the surface of the semiconductor chip 200.

The material of the conductive connecting pillars 210 may be metal, for example, copper. The conductive connection pillars 210 may electrically connect the semiconductor chip 200 and a carrier plate 300.

Figure 14:
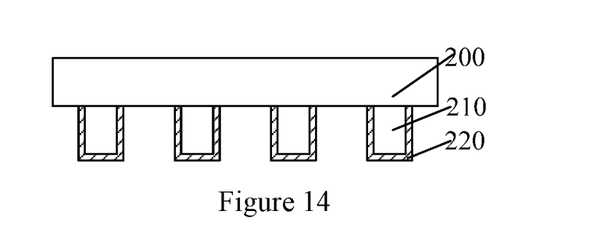
FIGS. 14 to 20 illustrate structures corresponding to certain stages of an exemplary flip-chip method consistent with the disclosed embodiments.
Figure 15:
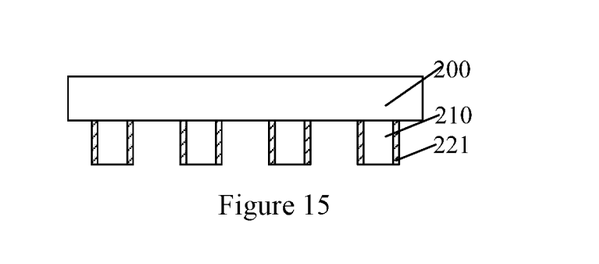

Returning to FIG. 13, first barrier layers are then formed on the sidewalls of the conductive connection pillars 210 (S302), and the first barrier layers expose the second surfaces 210b of the conductive connection pillars 210. FIGS. 14-15 illustrate corresponding structures.

Referring to FIG. 14, barrier material layers 220 are formed on the second surfaces 210b and the sidewalls of the conductive connection pillars 210. In one embodiment, the material of the barrier material layers 220 is insulation glue, and the process of forming the barrier material layers 220 is a brushing process. Since the barrier material layers 220 are formed on both the second surfaces 210b and the sidewalls of the conductive connection pillars 210, the brushing process does not require strict control on the position of the brushing. Hence, the difficulty in forming the barrier material layers 220 may be decreased.

In some other embodiments, the material of the barrier material layer 220 may be metal oxide, and the process of forming the barrier material layer 220 may be an oxidation process, including dry oxidation or wet oxidation. For example, when the conductive connection pillars 210 are copper pillars, the material of the barrier material layers 220 may be copper oxide.

As shown in FIG. 15, the barrier material layers 220 on the second surfaces 210b are removed, and first barrier layers 221 are thus formed on the sidewalls of the conductive connection pillars 210. The barrier material layers 220 on the second faces 210b may be removed by a sanding process.

The function of the first barrier layers 221 includes preventing the material of the solder pillars from flowing upward along the sidewalls of the conductive connection pillars 210 during a subsequent reflow-soldering process.

In one embodiment, the material of the first barrier layers 221 is insulation glue, and the material type of the first barrier layers 221 is different from the material type of the subsequent solder pillars. The first barrier layers 221 may thus prevent the material of the solder pillars from flowing upward along the sidewalls of the conductive connection pillars during a subsequent reflow-soldering process, and thus avoid the quality degradation of the solder layers. Moreover, since the material type of the first barrier layers 221 and the material type of the subsequent solder pillars are different, the material of the solder pillars may not flow upward along the sidewalls of the first barrier layers 221.

In some other embodiments, the material of the first barrier layers may be metal oxide.

In one embodiment, the first barrier layers 221 have a thickness in a range of 10 micrometers to 30 micrometers, such as 10 micrometers, 15 micrometers, 20 micrometers, or 30 micrometers. If the thickness of the first barrier layers 221 is larger than 30 micrometers, some of the material of the first barrier layers may be wasted. Moreover, if the thickness of the first barrier layers 221 is too large, the space subsequently formed between adjacent conductive connection pillars 210 may be too small, and it is thus difficult to fill the space between adjacent conductive connection pillars 210 with a plastic encapsulation layer. If the thickness of the first barrier layers 221 is less than 10 micrometers, the ability of the first barrier layers 221 in preventing the material of the solder pillars from flowing upward along the side walls of the conductive connection pillars 210 may be reduced.

In some other embodiments, the first barrier layers may be directly formed on the sidewalls of the conductive connection pillars by using a brushing process. In this case, the position of the brushing should be strictly controlled so that the material of the first barrier layers is not brushed on the second surfaces of the conductive connection pillars.

Returning to FIG. 13, a carrier plate 300 is provided, and a plurality of solder pillars 320 is formed on a surface of the carrier plate 300 (S303), and FIGS. 5-7 illustrate corresponding structures. The number of the solder pillars 320 is equal to the number of the conductive connection pillars 210. In some other embodiments, there may be only one conductive connection pillar, and there may be only one solder pillar.

After the solder pillars 320 are subsequently brought into contact with the second surfaces 210b, each of the solder pillars 320 is connected to only one of the conductive connection pillars 210. The material of the solder pillars 320 may be tin, tin-silver alloy, tin-silver-copper alloy or tin-lead alloy.

In one embodiment, the carrier plate 300 is a substrate, such as a PCB board or a BT board. In some other embodiments, the carrier plate may be a lead frame.

Referring to FIG. 5, a method of forming the solder pillars 320 includes forming a mesh plate 310 on a surface of the carrier plate 300, wherein the mesh plate 310 has a plurality of through holes. A distance between centers of adjacent through holes is equal to a distance between the centers of adjacent conductive connection pillars 210. Referring to FIG. 6, the method of forming the solder pillars 320 also includes respectively forming a solder pillar 320 in each of the through holes by a printing process. Referring to FIG. 7, the method of forming the solder pillars 320 further includes removing the mesh plate 310 after the printing process is performed.

The advantages of forming the solder pillars 320 by the printing process include that the plurality of solder pillars 320 formed may have a uniform shape and a uniform size, and the spacing between the solder pillars 320 may be small.

During a subsequent reflow-soldering process, the solder pillars 320 are melted. The height of the solder layers 321 is lower than the height of the solder pillars 320, while the radial dimension of the solder layers 321 may become large. In one embodiment, the radial dimension of the solder pillars 320 is designed to be smaller than the radial dimension of the conductive connection pillars 210. Such configuration may prevent the radial dimension of the solder layers 321 from being excessively large, and reduce the risk of adjacent solder layers 321 being connected together. Moreover, the amount of solder materials may be decreased, and thus the costs may be decreased.

In one embodiment, the ratio of the radial dimension of the solder pillars 320 to the radial dimension of the conductive connection pillars 210 is in a range of ⅖ to ⅗, for example ½.

Figure 16:
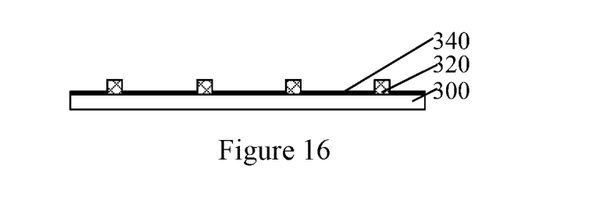
Figure 17:
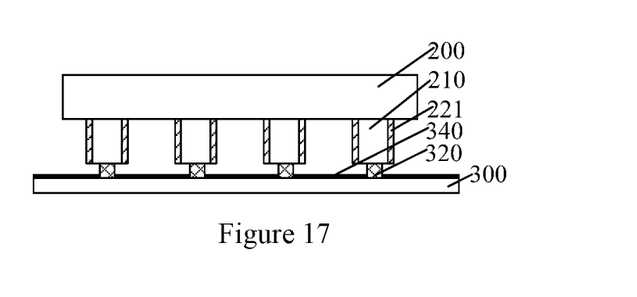

Returning to FIG. 13, a second barrier layer 340 is formed (S304). As shown in FIG. 16, the second barrier layer 340 is located on a surface of the carrier plate 300 around the solder pillars 320.

In one embodiment, after the mesh plate 310 is removed, a second barrier layer 340 is formed on a surface of the carrier plate 300 around the solder pillars 320.

In one embodiment, the material of the second barrier layer 340 is insulation glue, and the second barrier layer 340 is formed after the solder pillars 320 are formed.

In some other embodiments, the material of the second barrier layer is a plastic encapsulation material, and a process of forming the second barrier layer is a plastic encapsulation process. The second barrier layer is formed before the solder pillars are formed.

The second barrier layer 340 may prevent the material of the solder pillars 320 from flowing horizontally along the surface of the carrier plate 300 during a reflow-soldering process. Accordingly, collapse of the solder layers 321 may be prevented, and short circuits between the adjacent solder layers 321 may be avoided.

The thickness of the second barrier layer 340 is less than the height of the solder pillars 320. That is, a flow space for the melted material of the solder pillars 320 is not completely sealed, and heat generated during the melting process of the solder pillars 320 may be timely released into the environment. Accordingly, the surfaces of the solder layers subsequently formed may be smooth, and the quality of the solder layers may thus be improved.

In one embodiment, the thickness of the second barrier layer 340 is in a range of 10 micrometers to 30 micrometers, such as 10 micrometers, 15 micrometers, 20 micrometers, or 30 micrometers. If the thickness of the second barrier layer 340 is larger than 30 micrometers, some of the material for the second barrier layers 340 is wasted. Further, as the second barrier layer 340 is too thick, the heat generated during the melting process of the solder pillars 320 may not be effectively dissipated. If the thickness of the second barrier layer 340 is less than 10 microns, the second barrier layer 340 may not effectively block the material of the solder pillars 320 during a subsequent reflow-soldering process.

Returning to FIG. 13, after the first barrier layers 221 and the second barrier layer 340 are formed, the solder pillars 320 are brought into contact with the second surfaces 210b (S305). As FIG. 17, the conductive connection pillars 210 are located above the solder pillars 320, and a center of each conductive connection pillars 210s is aligned with the center of its corresponding solder pillar 320. During the subsequent reflow-soldering process, as the conductive connection pillars 210 are placed above the solder pillars 320, under the action of gravity, the melted material of the solder pillars 320 may not flow to the semiconductor chip 200.

Figure 18:
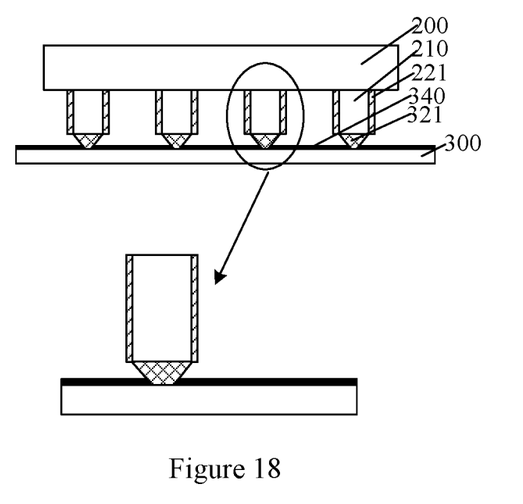

Returning to FIG. 13, after the solder pillars 320 are brought into contact with the second surfaces 210b, a reflow-soldering process is performed (S306). As shown in FIG. 18, after the reflow-soldering process, the solder pillars 320 turn into solder layers 321.

In one embodiment, the height of the solder pillars 320 is in a range of 20 micrometers to 100 micrometers, and correspondingly, the height of the solder layers 321 is in a range of 5 micrometers to 30 micrometers.

In one embodiment, the width of the solder layers 321 gradually decreases in a direction from the conductive connection pillars 210 to the carrier plate 300 and along the normal direction of the surface of the carrier plate 300.

In one embodiment, each of the solder layers 321 includes a solder top surface in contact with the second surface. The radial dimension of the solder top surface is less than or equal to the total radial dimension of the first barrier layer 221 and the conductive connection pillar 210. The total radial dimension of the first barrier layer 221 and the conductive connection pillar 210 is equal to the sum of the radial dimension of the conductive connection pillar 210 and twice of the thickness of the first barrier layer 221.

Figure 19:
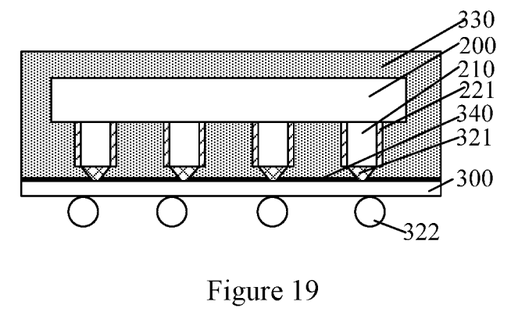

Returning to FIG. 13, after the reflow-soldering process, a plastic encapsulation layer 330 is formed above the carrier plate 300, the semiconductor chip 200, the conductive connection pillars 210, and the solder layers 321 (S307). As shown in FIG. 19, the plastic encapsulation layer 330 covers the first barrier layers 221 and the second barrier layer 340.

In some other embodiments, after the reflow-soldering process, the first barrier layers 221 and the second barrier layer 340 are removed. After the first barrier layers 221 and the second barrier layer 340 are removed, a plastic encapsulation layer is formed above the carrier plate, the semiconductor chip, the conductive connection pillar, and the solder layers.

In one embodiment, the carrier plate 300 is a substrate. Ball implantation is performed on a surface of the carrier plate 300 away from the semiconductor chip 200, forming solder balls 322 on a surface of the carrier plate 300 away from the semiconductor chip 200, as shown in FIG. 19.

Figure 20:
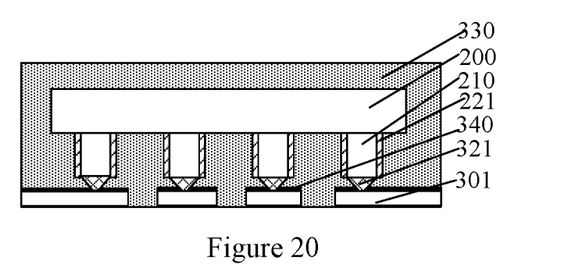

In some other embodiments, referring to FIG. 20, the carrier plate 301 is a lead frame, and ball implantation on a surface of the carrier plate 301 away from the semiconductor chip 200 is not need.

As disclosed, the technical solutions of the present disclosure have the following advantages.

In the flip-chip method provided by the technical solutions of the present disclosure, before the solder pillars are brought into contact with the second surfaces, the first barrier layers are formed on sidewalls of the conductive connection pillars, and the second barrier layer is formed on the surface of the carrier plate around the solder pillars. During the reflow-soldering process, the first barrier layers may prevent the solder pillar material from flowing upward along the sidewalls of the conductive connection pillars, thereby avoiding the formation of voids in the solder layers, thereby improving the quality of the solder layers. Further, during the reflow-soldering process, the second barrier layer may limit the flow space of the solder pillar material, thus avoiding the horizontal flow of the solder pillar material along the surface of the carrier plate. Thereby, the collapse of the solder layers may be avoided, and short circuits between the adjacent solder layers may be prevented.

The embodiments disclosed herein are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit and scope of the invention, such other modifications, equivalents, or improvements to the disclosed embodiments are intended to be encompassed within the scope of the present disclosure.

What is claimed is:

1. A flip-chip method, comprising:
    providing a semiconductor chip and conductive connection pillars, wherein each of the conductive connection pillars has a first surface and a second surface opposite to the first surface;
    fixing the conductive connection pillars on a surface of the semiconductor chip, wherein the first surfaces of the conductive connection pillars face the semiconductor chip and are in direct contact with the surface of the semiconductor chip;
    providing a carrier plate;
    forming solder pillars directly on a surface of the carrier plate;
    forming a barrier layer directly on the surface of the carrier plate around the solder pillars;
    bringing the solder pillars into contact with the second surfaces of the conductive connection pillars, wherein the conductive connection pillars are located above the solder pillars; and
    performing a reflow-soldering process on the solder pillars, thereby forming solder layers from the solder pillars.

2. The flip-chip method according to claim 1, further including:
    forming the barrier layer after the solder pillars are formed, wherein:
        the barrier layer is made of a material including an insulation glue and formed by a brushing process.

3. The flip-chip method according to claim 1, farther including:
    forming the barrier layer before the solder pillars are formed, wherein:
    the barrier layer is made of a material including a plastic, encapsulation material and formed by a plastic encapsulation process.

4. The flip-chip method according to claim 1, wherein a thickness of the barrier layer is less than a height of the solder pillars.

5. The flip-chip method according to claim 4, wherein the thickness of the barrier layer is in a range of about 10 micrometers to about 30 micrometers.

6. The flip-chip method according to claim 1, wherein:
    each of the solder pillars is connected to one of the conductive connection pillars; and
    forming the solder pillars includes:
        forming a mesh plate on the carrier plate, wherein the mesh plate has a plurality of through holes, and a center-to-center distance of adjacent through holes is substantially equal to a center-to-center distance of adjacent conductive connection pillars;

forming a solder pillar in each of the through holes by a printing process; and removing the mesh plate.

7. The flip-chip method according to claim 1, wherein a radial dimension of the solder pillars is smaller than a radial dimension, of the conductive connection pillars.

8. The flip-chip method according to claim 1, wherein a ratio of the radial dimension of the solder pillars to the radial dimension of the conductive connection pillars is in a range of ⅖ to ⅗.

9. The flip-chip method according to claim 1, further comprising:

after the reflow-soldering process, removing the barrier layer and forming a plastic encapsulation layer on the carrier plate, the semiconductor chip, the conductive connection pillars, and the solder layers; or after the reflow-soldering process, forming the plastic encapsulation layer over the carrier plate, the semiconductor chip, the conductive connection pillars, and the solder layers, wherein the plastic encapsulation layer covers the barrier layer.

10. A flip-chip method, comprising:

providing a semiconductor chip and conductive connection pillars, wherein each of the conductive connection pillars has a first surface and a second surface opposite to the first surface;

fixing the conductive connection pillars on a surface of the semiconductor chip, wherein the first surfaces of the conductive connection pillars face the semiconductor Chip and are in direct contact with the surface of the semiconductor chip;

forming first barrier layers on sidewalls of the conductive connection pillars, wherein the first barrier layers expose the second surfaces of the conductive connection pillars;

providing a carrier plate;

forming solder pillars directly on a surface of the carrier plate;

forming a second barrier layer directly on the surface of the carrier plate around the solder pillars;

bringing the solder pillars into contact with the second surfaces of the conductive connection pillars, wherein the conductive connection pillars are located above the solder pillars; and performing a reflow-soldering process on the solder pillars, thereby forming solder layers from the solder pillars.

11. The flip-drip method according to claim 10, Wherein forming the first barrier layers includes:

forming harrier material layers on the second surfaces and sidewalls of the conductive connection pillars; and removing the barrier material layers on the second surfaces, thereby forming the first barrier layers on the sidewalls of the conductive connection pillars.

12. The flip-chip method according to claim 11, wherein:

the first harrier layers are made of a material including an insulation glue or a metal oxide; and forming the first barrier layers includes a brushing process or an oxidation process.

13. The flip-chip method according to claim 10, wherein the first battier layers have a thickness in a range of about 10 micrometers to about 30 micrometers.

14. The flip-chip method according to claim 10, further including:

forming the second barrier layer after the solder pillars are formed, wherein:

the second barrier layer is made of a material including an insulation glue and formed by a brushing process.

15. The flip-chip method according to claim 10, further including:

forming the second barrier layer before the solder pillars are formed, wherein:

the second barrier layer is made of a material including a plastic encapsulation material and formed by a plastic encapsulation process.

16. The flip-chip method according to claim 10, wherein a thickness of the second barrier layer is less than a height of the solder pillars.

17. The flip-chip method according to claim 16, wherein the thickness of the second barrier layer is in a range of about 10 micrometers to about 30 micrometers.

18. The flip-chip method according to claim 10, wherein:

each of the solder pillars is connected to one of the conductive connection pillars, and forming the solder pillars includes:

forming a mesh plate on the carrier plate, wherein the mesh plate has a plurality of through holes, and a center-to-center distance adjacent through holes is substantially equal to a center-to-center distance of adjacent conductive connection pillars;

forming a solder pillar in each of the through boles by a printing process; and removing the mesh plate.

19. The flip-chip method according to claim 10, wherein a radial dimension of the solder pillars is smaller than a radial dimension of the conductive connection pillars.

20. The flip-chip method according to claim 10, further comprising:

after the reflow-soldering process, removing the first barrier layers and the second barrier layer and forming a plastic encapsulation layer on the carrier plate, the semiconductor chip, the conductive connection pillars, and the solder layers; or after the reflow-soldering process, forming the plastic encapsulation layer over the carrier plate, the semiconductor chip, the conductive connection pillars, and the solder layers, wherein the plastic encapsulation layer covers the first barrier layers and the second barrier layer.

* * * * *